United States Patent [19]
Griffin et al.

[11] Patent Number: 5,379,185
[45] Date of Patent: Jan. 3, 1995

[54] LEADLESS SURFACE MOUNTABLE ASSEMBLY

[75] Inventors: Curtis Griffin, Boca Raton; John R. Siomkos, Royal Palm Beach; Geroncio Tan, Sunrise, all of Fla.

[73] Assignee: Motorola, Inc., Schaumburg, Ill.

[21] Appl. No.: 143,728

[22] Filed: Nov. 1, 1993

[51] Int. Cl.[6] .............................. H05K 7/20
[52] U.S. Cl. ...................... 361/709; 174/16.3; 174/35 R; 361/715; 361/730; 361/814; 361/816; 439/66
[58] Field of Search ............. 174/35 R, 51; 361/704, 361/707, 710, 715, 719, 720, 730, 752, 753, 757, 768, 770, 792–795, 807, 808, 814, 818; 439/66, 69, 91

[56] References Cited

U.S. PATENT DOCUMENTS

| | | | |
|---|---|---|---|
| 5,061,191 | 10/1991 | Casciotti et al. | 439/66 |
| 5,123,849 | 6/1992 | Deak et al. | 439/66 |
| 5,155,661 | 10/1992 | Nagesh et al. | 361/704 |
| 5,229,917 | 7/1993 | Harris et al. | 361/715 |

OTHER PUBLICATIONS

Buchoff, "Solving High Density Electronic Problems With Elastomeric Connectors", Nepcon Technical Program Conference Anaheim, Mar. 1990, pp. 3–7.
Motorola, Inc., RF Products Selector Guide and Cross Reference Manual, "RF Amplifiers" pp. 60–16, Mar. 1993.

*Primary Examiner*—Gregory D. Thompson
*Attorney, Agent, or Firm*—Andrew S. Fuller

[57] ABSTRACT

A leadless surface mountable assembly (100) includes a heat dissipating cover (110), a substrate (120), a heat generating semiconductor device (130), and a spacer (140). The substrate (120) is mounted on the interior surface (115) of the cover (110). The heat generating semiconductor device (130) is thermally coupled to the cover (110) and electrically coupled to the substrate (120). The spacer (140) has an interface portion (147) which provides an electrical interface to the substrate (120). Electrical contacts (144) are disposed on the interface portion (147) of the spacer (140) and are electrically coupled to the substrate (120) through electrical conductors (145) within the spacer (140).

19 Claims, 3 Drawing Sheets

LEADLESS SURFACE MOUNTABLE ASSEMBLY

TECHNICAL FIELD

This invention relates to electrical assemblies, and in particular, to surface mountable assemblies.

BACKGROUND

Products utilizing electrical assemblies which generate an appreciable amount of heat, usually require that heat dissipation paths be designed in to prevent overheating of these assemblies. One popular solution is to locate a heat sink, such as a metal plate, at or near the site of the heat generating assembly, and providing a thermal path for heat to travel from this heat sink to other heat dissipating locations. For example, a relatively large power amplifier can be implemented on a substrate, and this substrate is mounted on a heat sink, and the heat sink is mounted on another substrate such as a printed circuit board. A heat dissipation path could be created by thermally connecting the heat sink to the frame or chassis of the host device. Leads provide the electrical connection between the substrate containing the power amplifier and the printed circuit board. Similar configurations are quite common in the art.

Despite some of the obvious manufacturing advantages of using leadless surface mountable assemblies, the use of leads has persisted to provide electrical connection between the assembly containing the heat generating electrical components and the general circuitry for the application. This results from the traditional design of placing the heat sink, which can be rather bulky, directly under the assembly, so that the electrical connections must be routed around the heat sink. Thus, leads are often used to accomplish this routing.

However, there are several problems which are inherent in the use of leaded electrical assemblies in the assembly of electronic circuitry. One such problem is that of lack of planarity, i.e., where the ends of the leads are not all on the same level or plane. Lack of planarity may prevent proper electrical connection between the component and the supporting substrate, thus affecting the ease of manufacture and the reliability of the assembly. Automatic placement of leaded components can also be difficult, depending on the size and orientation of the assembly, and hand placement may be necessary. Some applications, such as those involving wireless communications, require shielding of certain electrical assemblies to minimize electrical interference and spurious radiation emissions from the assembly. With leaded assemblies, the shields need openings to accommodate the leads, or alternatively, the shields need to be shaped to encompass the leads. Assuming the application is implemented on a printed circuit board (PCB), the PCB layout must accommodate these shields and this can reduce the space available for the other circuit components.

A further problem exists in current designs addressing the heat dissipation path between the electrical assembly and the chassis of the host device. When the assembly is mounted on the heat sink and the heat sink mounted on the printed circuit board, an excision is typically made through the printed circuit board to access the heat sink. This processing of the printed circuit board increases the number manufacturing operations and add to manufacturing costs. Moreover, an excision in the printed circuit board reduces the surface area available for electrical components, thereby increasing the product size.

The problems described thus far are particularly prevalent with the use of power amplifiers in the wireless communications industry. The packaging of high output power amplifiers or other high energy assemblies with large heat dissipation requirements have traditionally relied on leads to electrically connect the assembly to the printed circuit board. However, the demand for increase product quality, reduced manufacturing costs, and product miniaturization requires new solutions to the packaging design for these assemblies. As such, it is desirable to eliminate the leads for these electrical assemblies and to provide improved electrical performance in a smaller package, while maintaining the heat dissipating characteristics of prior art electrical assemblies.

DETAILED DESCRIPTION OF THE PREFERRED EMBODIMENT

Generally, the present invention provides for a leadless surface mountable assembly with heat dissipation characteristics. The assembly includes a circuit carrying substrate, mounted within a heat dissipating cover, which also functions as an electrical shield. An electrical interface to the assembly is provided through a spacer or mounting frame, which is electrically coupled to the substrate. The mounting frame may be soldered directly to a printed circuit board.

Figure 1:
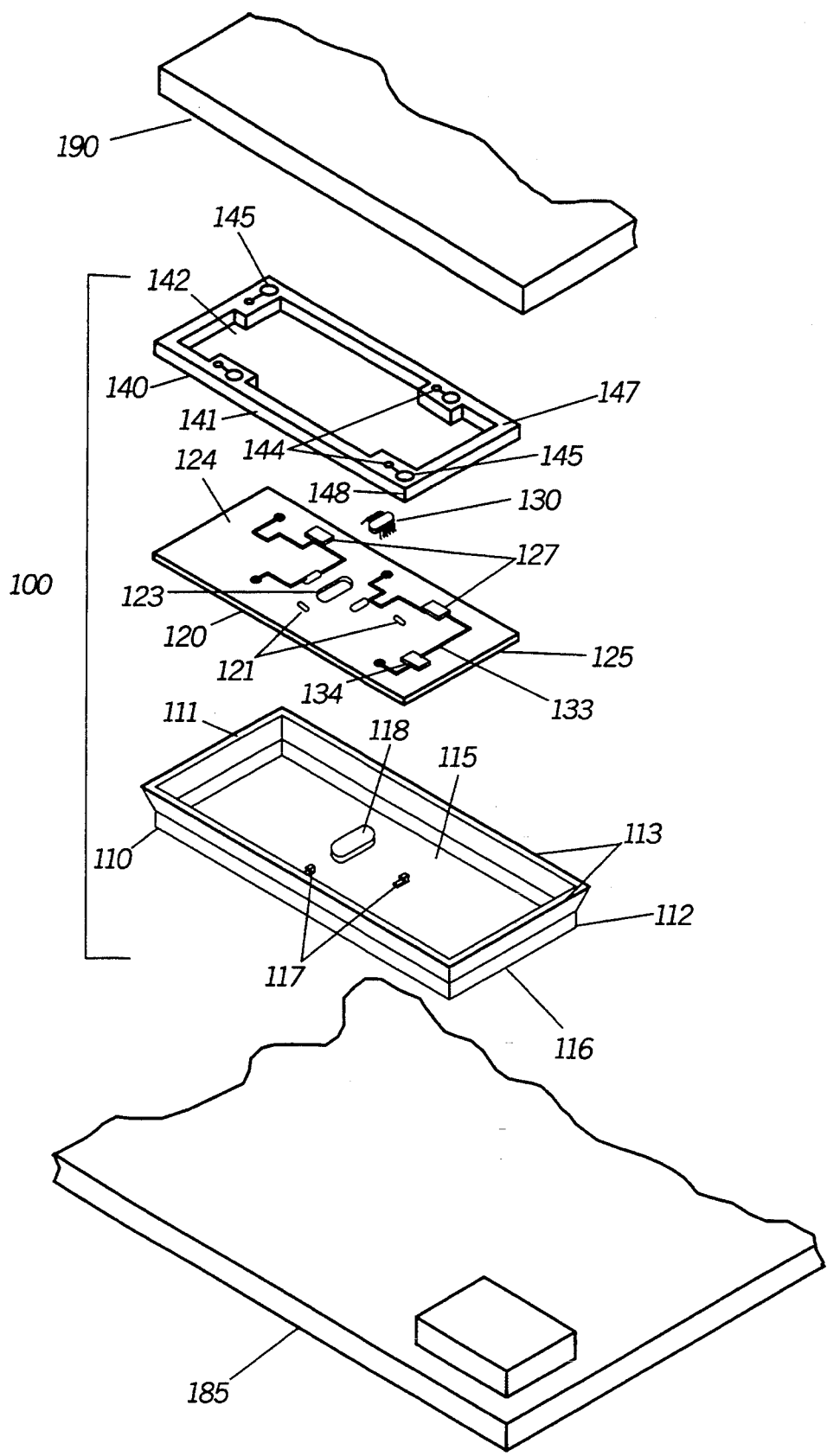
FIG. 1 is an exploded perspective view of a surface mountable assembly in accordance with the present invention.
Figure 2:
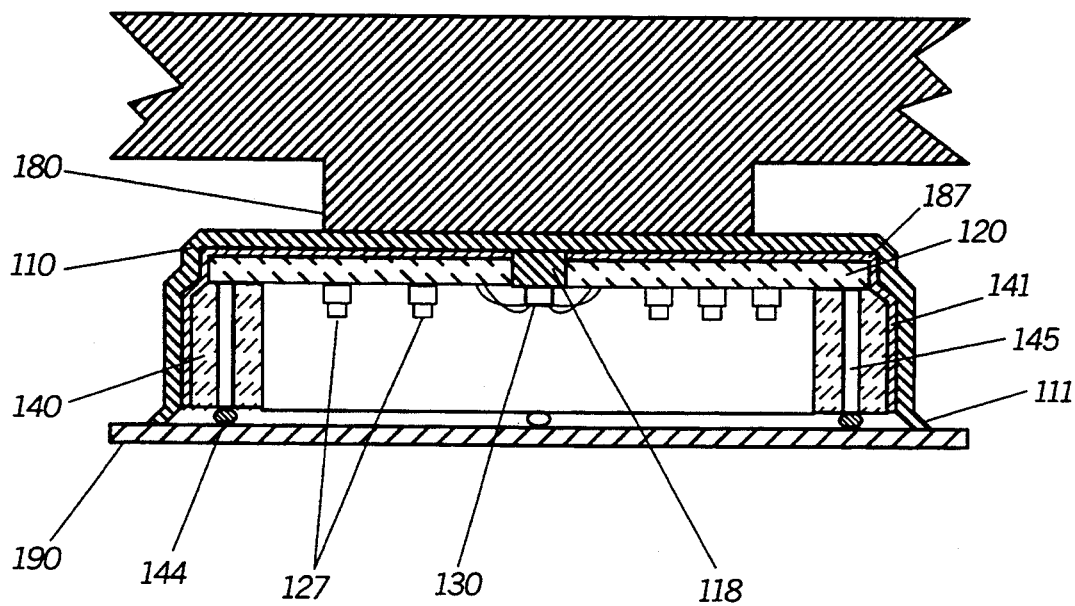
FIG. 2 is a cross-sectional view of the surface mountable assembly of FIG. 1.

The present invention can be more fully understood with references to FIGS. 1 and 2. FIG. 1 is a perspective view of a surface mountable assembly 100 in accordance with the present invention. The assembly 100 includes a heat dissipating cover or housing 110, a circuit carrying substrate 120 having electrical components 127, 130 thereon, and a spacer 140 or mounting frame. In a typical application, the assembly 100 mounted onto a support substrate, such as printed circuit board 190. A thermally conductive path is provided between the assembly 100 and a heat dissipating structure, such as the chassis 185 or frame of a host device.

The cover 110 is formed from a thermally conductive material, such as nickel, silver, aluminum, copper, or other suitable heat dissipating material. The cover 110 functions as a heat sink for the assembly 100. The cover 110 has a base portion 112 with depending sidewalls 113 to form a structure having an interior surface 115 and an exterior surface 116. The sidewalls 113 are of sufficient height to allow clearance of the substrate 120, the electrical components 127, 130, and the spacer 140, when the assembly 100 is fully assembled. The sidewalls terminate to form a mounting surface 111 for the assembly 100. Mounting extensions 117 on the interior surface 115 of the cover 110 help to properly locate the substrate 120 within the cover 110. Additionally, a device mount 118 projects from the interior surface 115 of the cover 110, the function of which will be explained below. Preferably, the cover 110 is also electrically conductive, such that the cover 110 can function as an electrical shield to help reduce or prevent electrical interference between the electrical components 127, 130 of the assembly 100 and other electrical components of a host device.

The substrate 120 is formed from materials typically used to construct printed circuit boards, such as ceramic and the like. Mounting slots 121 located on the substrate 120 accommodate the mounting extensions 117 on the interior surface 115 of the cover 110, to locate and align the substrate 120. Similarly, an aperture 123 extending through the substrate 120 accommodates the device mount 118 of the cover 110. The substrate 120 has a first planar surface 124 having circuitry thereon, and a second planar surface 125 having conductive material disposed thereon to form an electrical ground plane. The second surface 125 is mounted to the interior surface 115 of the cover 110 and thermally engages the cover 110. In the preferred embodiment, the substrate 120 carries the electrical circuitry and components of a power amplifier. As such, the electrical components 127, 130 include a power transistor 130, which is a heat generating semiconductor device. The power transistor 130 is electrically coupled to the substrate 120 through wire bonding, or other coupling methods such as by using flexible circuits, flip chip technology, and the like. The power transistor 130 generates heat which must be dissipated to prevent damage to the power amplifier, and other surrounding components. Consequently, the power transistor 130 is mounted on the device mount 118, thereby thermally coupling the transistor 130 to the cover 110, and providing a thermally conductive path for rapid transfer of heat from the transistor 130. Thus, the device mount 118 is a convenient thermal conduit for transferring heat from the power transistor 130, or other device, to the cover 110.

The spacer 140 is formed from circuit board material, similar to the substrate 120. The spacer 140 can be integrally formed on the substrate 120 and may comprise one or more structural members in combination. However, the orientation of the spacer 140 and the substrate 120 must be such as to allow accommodation of the electrical components 127, 130 on the substrate 120. In the preferred embodiment, the spacer 140 is a rectangular ring-shaped structure having a cavity 142 therethrough, and is formed to fit along the border of the first surface 124 of the substrate 120. The spacer 140 is of sufficient height and the cavity 142 sufficiently large to accommodate the electrical components 127, 130. One function of the spacer 140 is to provide a leadless electrical interface to the substrate 120. Thus, the spacer 140 has a first planar surface 148 which contacts the second planar surface 125 of the substrate 120, and a second planar surface 147 which forms the electrical interface portion of the assembly 100. Conductive vias 145 form electrical conductors extending through the spacer 140 to electrically couple the first surface 148 to the interface portion 147. The conductive vias 145 can be formed to have desirable impedance matching characteristics by varying the dimensions, and other attributes of the vias 145. This is a significant advantage of using the spacer 140 as an electrical interface versus leads commonly found in the prior art. The spacer 140 also provides electrical isolation between input and output signals to the assembly 100. The spacer 140 is selectively plated with conductive material along the sides 141 to facilitate an electrical ground connection which provides electrical isolation for the electrical conductors represented by the conductive vias 145. As indicated earlier, the spacer 140 provides the electrical interface or electrical ports for the assembly 100. Solder deposits in the form of collapsible solder balls 144 are located on the interface portion 147 of the spacer 140 to provide or facilitate the electrical contacts. The assembly 100 is typically soldered to a printed circuit board 190, or other support substrate such as flexible circuit board, and the like.

Referring to FIG. 2, a cross-sectional view of the assembly 100 is shown. The assembly 100 is mounted to the printed circuit board 190, and is in thermal and electrical contact with the chassis 185 of the host device. The substrate 120 is attached to the cover 110 with solder 187, such that the substrate 120 is thermally and electrically coupled to the cover 110. Moreover, an electrical coupling is established between the cover 110 and the plated sides 141 of the spacer 140. Thus, an effective electrical ground connection is established between the cover 110, the ground plane of the substrate 120, and the plated sides 141 of the spacer 140. The power transistor 130 is mounted onto the device mount 118 and is electrically coupled to the power amplification circuitry of the substrate 120. Electrical conductors 133 (see FIG. 1) convey electrical signals from electrical ports 134 (see FIG. 1) on the substrate 120, through the conductive vias 145 of the spacer 140, to the solder balls 144 on the interface portion of the spacer 140. Preferably, the interface portion 147 is substantially coplanar with the mounting surface 111 of the cover 110 to present a planar mounting surface for the assembly 100. This facilitates handling by automated parts placement equipment during manufacturing operations utilizing the assembly 100.

Figure 3:
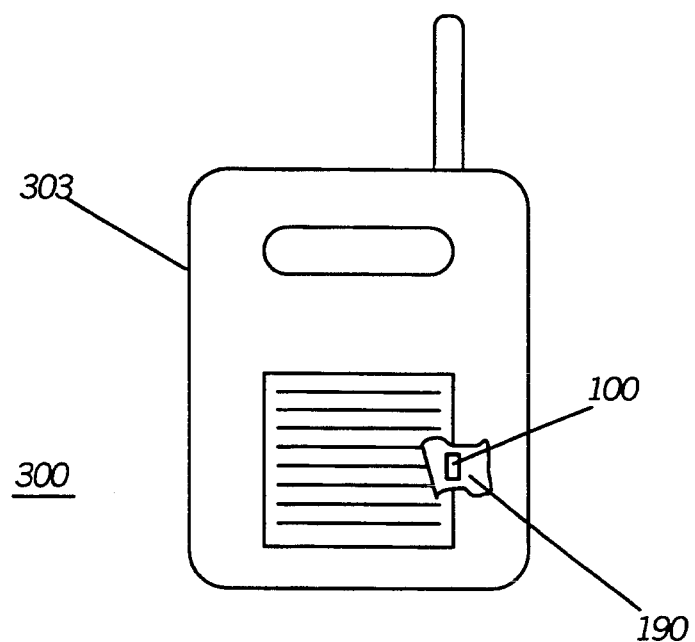
FIG. 3 is a front view of a communication device that incorporates the assembly of FIG. 1.

Referring to FIG. 3, a front view of a communication device that incorporates the assembly 100 is shown. The communication device 300 is a conventional two-way radio, as known in the art. The radio 300 has a housing 303 in which the printed circuit board 190 is situated. The printed circuit board carries well-known communications circuitry for communicating over a radio frequency channel. The circuitry incorporates the assembly 100, which is a power amplifier, mounted on the printed circuit board 190.

As evident from the description above, the present invention addresses many problems present in the prior art. The essential components of the assembly 100 are substantially enclosed within a cover 110, which functions as a heat sink and also as an electrical shield. This packaging presents a readily accessible path for the establishment of thermal contact between the chassis 185 and the heat sink without having to make structural accommodating provisions to the printed circuit board 190, or other support substrate. No excisions are needed in the printed circuit board 190 to access the heat sink 110, thus leaving more room for electrical components, which facilitates product miniaturization. Additionally, the package avoids the problems associated with leads, such as excess space consumption, lack of lead coplanarity, electrical interference among leads, among others. Electrically isolated input and output electrical ports are provided, which can be tuned for impedance matching. Furthermore, the assembly 100 provides a surface mountable package which facilitates automated assembly 100, and which is smaller than traditional packages. The concepts embodied in this invention are particularly useful for power amplifiers and other applications requiring significant heat dissipation and electrical shielding. Manufacturers utilizing the present invention can realize increase manufacturing efficiency and lower manufacturing costs.

What is claimed is:

1. A leadless surface mountable assembly, comprising:
   a heat dissipating cover;
   substrate mounted within the cover;
   a heat generating semiconductor device thermally coupled to the cover and electrically coupled to the substrate;
   spacer having an interface portion, the interface portion having electrical conductors thereon electrically coupled to the substrate wherein the spacer hag a cavity being sufficiently large to accommodate the semiconductor device; and
   a plurality of electrical contacts disposed on the interface portion of the spacer, the plurality of electrical contacts being electrically coupled to the electrical conductors.

2. A leadless surface mountable assembly as defined in claim 1, wherein the electrical conductors comprise conductive vias extending through the spacer.

3. A leadless surface mountable assembly as defined in claim 1, wherein the spacer is selectively plated with conductive material such that the electrical conductors are electrically isolated.

4. A leadless surface mountable assembly as defined in claim 1, wherein the cover has a mounting surface, the mounting surface being substantially coplanar with the interface portion of the spacer.

5. A leadless surface mountable assembly as defined in claim 1, wherein the plurality of electrical contacts comprise solder deposits disposed on the interface portion of the spacer.

6. A leadless surface mountable assembly as defined in claim 5, wherein the solder deposits comprise collapsible solder balls.

7. A leadless surface mountable assembly as defined in claim 1, wherein the substrate is electrically coupled to the cover to provide electrical shielding for the assembly.

8. A leadless surface mountable assembly as defined in claim 1, wherein the heat generating semiconductor device is a power transistor.

9. A leadless surface mountable assembly as defined in claim 1, wherein the substrate has an aperture therethrough, and the heat generating semiconductor device is thermally coupled to the cover through the aperture.

10. A leadless surface mountable assembly as defined in claim 1, wherein the spacer is a ring-shaped structure having a cavity extending therethrough.

11. The leadless surface mountable assembly of claim 1, wherein the substrate and semiconductor device are substantially enclosed within the cover.

12. A leadless surface mountable assembly comprising:
    heat dissipating cover;
    a substrate mounted within the cover;
    a heat generating semiconductor device thermally coupled to the cover and electrically coupled to the substrate:
    a spacer having an interface portion, the interface portion having electrical conductors thereon electrically coupled to the substrate wherein the spacer has a cavity extending therethrough, the cavity being sufficiently large to accommodate the semiconductor device: and
    a plurality of electrical contacts disposed on the interface portion of the spacer, the plurality of electrical contacts being electrically coupled to the electrical conductors.

13. A power amplifier, comprising:
    a heat dissipating cover having an interior surface and a mounting surface;
    a substrate mounted on the interior surface of the cover, the substrate having a surface which thermally engages the cover;
    a power transistor thermally coupled to the heat dissipating cover and electrically coupled to the substrate;
    a spacer having an interface portion, the interface portion having electrical conductors thereon electrically coupled to the substrate wherein the spacer has a cavity being sufficiently large to accommodate the semiconductor device; and
    a plurality of electrical contacts disposed on the interface portion of the spacer, the plurality of electrical contacts being electrically coupled to the electrical conductors.

14. A power amplifier as defined in claim 13, wherein the electrical conductors comprise conductive vias extending through the spacer.

15. A power amplifier as defined in claim 13, wherein the interface portion of the spacer is substantially coplanar with the mounting surface of the cover.

16. A power amplifier as defined in claim 13, wherein the substrate is electrically coupled to the cover to provide electrical shielding for the assembly.

17. A power amplifier as defined in claim 13, wherein the spacer is a ring-shaped structure having a cavity extending therethrough.

18. A radio, comprising:
    a radio housing;
    a printed circuit board situated within the housing, the circuit board carrying communications circuitry for communicating over a radio frequency channel;
    a power amplifier mounted on the printed circuit board, the amplifier comprising:
      a heat dissipating cover having an interior surface and a mounting surface;
      a substrate mounted within the cover, the substrate having a surface which thermally engages the cover;
      a power transistor thermally coupled to the heat dissipating cover and electrically coupled to the substrate;
      a spacer having an interface portion, the interface portion having electrical conductors thereon electrically coupled to the substrate wherein the spacer has a cavity being sufficiently large to accommodate the semiconductor device; and
      a plurality of electrical contacts disposed on the interface portion of the spacer, the plurality of electrical contacts being electrically coupled to the electrical conductors.

19. A leadless surface mountable assembly, comprising:
    a heat dissipating cover having a base portion with depending sidewalls defining an interior surface, the depending sidewalls terminating to form a mounting surface for the cover;
    a substrate mounted within the cover;

a heat generating semiconductor device thermally coupled to the cover and electrically coupled to the substrate;

a spacer having an interface portion, the interface portion having electrical conductors thereon electrically coupled to the substrate, the interface portion being substantially coplanar with the mounting surface of the cover; and a plurality of electrical contacts disposed on the interface portion of the spacer, the plurality of electrical contacts being electrically coupled to the electrical conductors.

* * * * *